United States Patent
Sone et al.

(10) Patent No.: US 7,839,060 B2
(45) Date of Patent: Nov. 23, 2010

(54) PIEZOELECTRIC CERAMIC COMPOSITION AND OSCILLATOR

(75) Inventors: Hideaki Sone, Tokyo (JP); Masakazu Hirose, Tokyo (JP); Tomohisa Azuma, Tokyo (JP); Hideya Sakamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 134 days.

(21) Appl. No.: 12/251,030

(22) Filed: Oct. 14, 2008

(65) Prior Publication Data

US 2009/0102324 A1 Apr. 23, 2009

(30) Foreign Application Priority Data

Oct. 18, 2007 (JP) .......................... P2007-271621
Oct. 18, 2007 (JP) .......................... P2007-271624

(51) Int. Cl.
*H01L 41/187* (2006.01)
(52) U.S. Cl. .................................................. 310/358
(58) Field of Classification Search ................ 310/358; 252/62.9 R, 62.9 PZ; 501/134
See application file for complete search history.

(56) References Cited

U.S. PATENT DOCUMENTS 3,640,866 A * 2/1972 Nishida et al. ........ 252/62.9 PZ

2002/0043642 A1 * 4/2002 Tanimoto et al. ...... 252/62.9 PZ

FOREIGN PATENT DOCUMENTS

JP  A-5-139824  6/1993
JP  A-2000-1367  1/2000

OTHER PUBLICATIONS

"Osicllator, Resonator, Filter Latest Technologies," 1986, Sogo gijutsu Shuppan Co., Ltd., pp. 119-121.

* cited by examiner

*Primary Examiner*—Walter Benson
*Assistant Examiner*—Derek J Rosenau
(74) *Attorney, Agent, or Firm*—Oliff & Berridge, PLC

(57) ABSTRACT

Provided is a piezoelectric ceramic composition which enables the attainment of sufficiently high $Q_{max}$ and good temperature characteristics of oscillation frequency $F_0$ when applied in an oscillator utilizing third harmonic mode of thickness longitudinal vibration. The piezoelectric ceramic composition contains a composite oxide having a perovskite structure. The composite oxide has a composition expressed by the chemical formula (1), while satisfying $0.91 \leq \alpha \leq 1.00$, $0 < \beta \leq 0.08$, $0.125 \leq x \leq 0.300$, $0.020 \leq y \leq 0.050$, and $0.040 \leq z \leq 0.070$ $$(Pb_\alpha Ln_\beta)(Ti_{1-(x+y+z)}Zr_xMn_yNb_z)O_3 \qquad (1)$$

where Ln signifies at least one element selected from the group consisting of La, Ce, Pr, Nd, Pm, Sm, Eu, Gd, Tb, Dy, Ho, Er, Tm, Yb, and Lu.

7 Claims, 5 Drawing Sheets

PIEZOELECTRIC CERAMIC COMPOSITION AND OSCILLATOR

BACKGROUND OF THE INVENTION

1. Field of the Invention

The present invention relates to a piezoelectric ceramic composition and an oscillator.

2. Related Background of the Invention

Since piezoelectric ceramic composition has a piezoelectric effect which generates electric polarization on being subjected to external pressure, and has an inverse piezoelectric effect which generates strain on being subjected to an external electric field, it is used as a material to perform interconversion between electric energy and mechanical energy. Owing to these effects, such piezoelectric ceramic composition has been used in varieties of products such as resonator (oscillator), filter, sensor, actuator, ignition element, and ultrasonic motor.

An example of the piezoelectric ceramic composition has been known, which is characterized in ceramic filter and the like utilizing a third harmonic wave of thickness longitudinal vibration is a piezoelectric ceramic composition prepared by adding Mn and Cr to a lead titanate system obtained by substituting a Pb part of $PbTiO_3$ with La to give a composition expressed by the general formula of $Pb_{1-3y/2}La_y TiO_3 + z \cdot \{(1-x)MnO_2 + (x/2) \cdot Cr_2O_3\}$, (o<x<1 and 0<z≦5% by weight), (Japanese Unexamined Patent Publication No. H5-139824).

SUMMARY OF THE INVENTION

When an oscillator provided with a piezoelectric element is used in oscillation circuits, a high $Q_{max}$ of the oscillator is required in order to guarantee the oscillation characteristics. In recent years, furthermore, good temperature characteristics of oscillation frequency $F_0$ have also been required to respond to the products requiring narrow tolerance of the oscillation frequency $F_0$, (unit: Hz). The term $Q_{max}$ referred to hereinafter signifies "tan $\theta_{max}$" with the definition of $\theta_{max}$ (unit: degree or radian) as a maximum value of the phase angle. In other words, the term $Q_{max}$ is the maximum value of $Q(=|X|/R)$ between the resonant frequency fr and the anti-resonant frequency fa, (where X is reactance and R is resistance). The phrase "good temperature characteristics of oscillation frequency $F_0$" means that, when the temperature of oscillator or oscillation circuit having the oscillator changes, the ratio of the amount of change of oscillation frequency $F_0$ to the amount of temperature change is small, and that the oscillation frequency $F_0$ is stable against the temperature change.

When, however, an oscillator utilizes a third harmonic wave of thickness longitudinal vibration (third harmonic mode of thickness longitudinal vibration), the applied frequency band is higher than that of oscillator or the like utilizing the flexion oscillation mode. As a result, conventional piezoelectric ceramic compositions cannot fully satisfy the $Q_{max}$ and the temperature characteristics of oscillation frequency $F_0$. The oscillator utilizing a third harmonic wave of thickness longitudinal vibration can be used for applications in, for example, resonator which is an element generating standard clock for controlling a micro-computer. Thus, also for substituting the expensive quartz oscillator, there is required a piezoelectric ceramic composition that functions sufficient performance when used in an oscillator which utilizes a third harmonic wave of thickness longitudinal vibration.

In this regard, an object of the present invention is to provide a piezoelectric ceramic composition which enables the attainment of sufficiently high $Q_{max}$ and good temperature characteristics of oscillation frequency $F_0$ when applied in an oscillator utilizing third harmonic mode of thickness longitudinal vibration, and to provide an oscillator which uses the piezoelectric ceramic composition.

The piezoelectric ceramic composition according to the present invention relates to a piezoelectric ceramic composition containing a composite oxide having a perovskite structure. The composite oxide in the piezoelectric ceramic composition has a composition expressed by $(Pb_\alpha Ln_\beta)(Ti_{1-(x+y+z)}Zr_x Mn_y Nb_z)O_3$, (where Ln signifies at least one element selected from the group consisting of La, Ce, Pr, Nd, Pm, Sm, Eu, Gd, Tb, Dy, Ho, Er, Tm, Yb, and Lu), and satisfies $0.91 \leq \alpha \leq 1.00$, $0 < \beta \leq 0.08$, $0.125 \leq x \leq 0.300$, $0.020 \leq y \leq 0.050$, and $0.040 \leq z \leq 0.070$.

The oscillator according to the present invention is equipped with a piezoelectric element composed of the piezoelectric ceramic composition according to the present invention.

Since the piezoelectric element in the above oscillator of the present invention is composed of the piezoelectric ceramic composition having the composition expressed by the above formula, the oscillator provides sufficiently high $Q_{max}$ and good temperature characteristics of oscillation frequency $F_0$ even when applied as an oscillator utilizing third harmonic mode of thickness longitudinal vibration.

The piezoelectric ceramic composition according to the present invention preferably has a tetragonal system perovskite structure, and has the lattice constant in the direction of a-axis of perovskite structure (length of a-axis of the crystal lattice of perovskite structure) within the range of 3.91 to 4.02 Angstrom.

In the above oscillator of the present invention, the piezoelectric element has a tetragonal system perovskite structure, and is composed of a piezoelectric ceramic composition having the length of a-axis of the crystal lattice within the range of 3.91 to 4.02 Angstrom, and thus the oscillator easily attains good temperature characteristics of oscillation frequency $F_0$ even when used as an oscillator utilizing third harmonic mode of thickness longitudinal vibration.

Since the above piezoelectric ceramic composition according to the present invention has the above composition, the lattice constant in the direction of a-axis of perovskite structure (length of a-axis of the crystal lattice of the perovskite structure) can surely be within the range of 3.91 to 4.02 Angstrom. According to the present invention, when the piezoelectric ceramic composition has a tetragonal system perovskite structure, since the length of a-axis and the length of b-axis (the lattice constant in the direction of b-axis) of the crystal lattice are identical to each other, the lattice constant in the direction of b-axis of perovskite structure is also within the range of 3.91 to 4.02 Angstrom.

In the piezoelectric ceramic composition according to the present invention, Ln is preferably La. The effect of the present invention is significantly achieved by this.

The piezoelectric ceramic composition according to the present invention preferably satisfies $0.13 \leq x \leq 0.25$, more preferably satisfies $0.13 \leq x \leq 0.20$, and most preferably satisfies $0.13 \leq x \leq 0.16$. The composition further significantly improves the temperature characteristics of oscillation frequency $F_0$.

The piezoelectric ceramic composition according to the present invention preferably satisfies $0.020 \leq y \leq 0.037$. The composition further significantly increases $Q_{max}$ and makes it difficult to decrease the resistivity of the piezoelectric ceramic composition, which makes the polarization treatment easy for conferring piezoelectric properties to the piezoelectric ceramic composition at the time of manufacturing piezoelectric element.

According to the present invention, there can be provided a piezoelectric ceramic composition which enables the attainment of sufficiently high $Q_{max}$ and good temperature characteristics of oscillation frequency $F_0$ when applied in an oscillator utilizing third harmonic mode of thickness longitudinal vibration. According to the present invention, the piezoelectric ceramic composition has a high Curie temperature, thus making it possible to provide a piezoelectric element which is difficult to be depolarized even at high temperatures. Since the piezoelectric ceramic composition of the present invention has a high Curie temperature, when used as a piezoelectric element of surface-mounting type oscillator, an oscillator with less degradation of piezoelectric characteristics even through a solder-reflow can be obtained.

DESCRIPTION OF THE PREFERRED EMBODIMENTS

Figure 1:
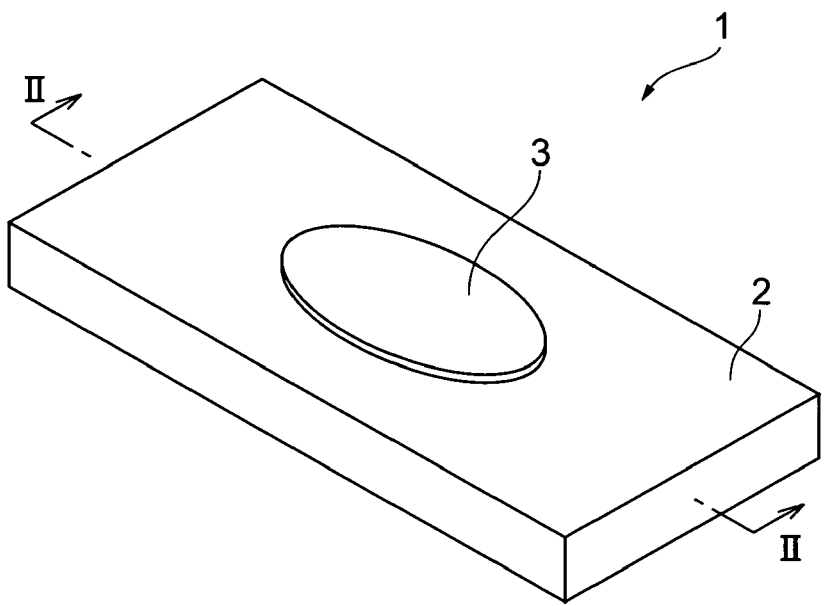
FIG. 1 shows a perspective view of an oscillator according to one embodiment of the present invention.

A preferred embodiment of the oscillator using the piezoelectric ceramic composition according to the present invention is described below properly referring to the drawings. The present invention, however, is not limited to the following embodiments.

Figure 2:
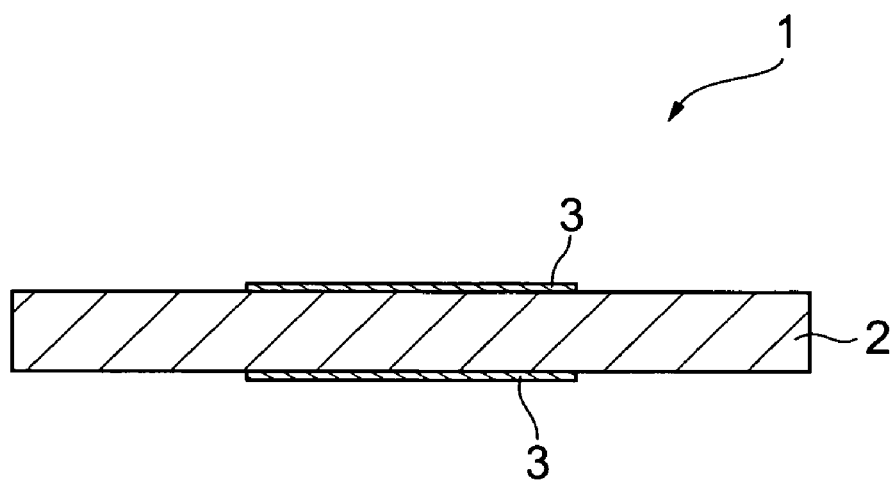
FIG. 2 shows a cross-sectional arrow view of FIG. 1 along II-II line.

FIG. 1 shows a perspective view of an oscillator of an embodiment of the present invention, and FIG. 2 shows a cross-sectional view of FIG. 1 along II-II line. The oscillator 1 given in FIGS. 1 and 2 is composed of a rectangular piezoelectric element 2 and a pair of vibrating electrodes 3 facing each other clamping the piezoelectric element 2 therebetween. One vibrating electrode 3 is formed at the center of upper face of the piezoelectric element 2, while the other vibrating electrode 3 is formed at center of lower face of the piezoelectric element 2. The piezoelectric element 2 is structured by the piezoelectric ceramic composition of the embodiment. Each vibrating electrode 3 is structured by a conductive material such as Ag.

The size of the piezoelectric element 2 may be adequate depending on the intended use. Examples of the approximate size thereof are 1.0 to 4.0 mm in length, 0.5 to 4.0 mm in width, and 50 to 300 μm in thickness. The vibrating electrode 3 is normally in circular shape, and the approximate size thereof is, for example, 0.5 to 3.0 mm in diameter, and 0.5 to 5 μm in thickness.

The above piezoelectric ceramic composition contains a composite oxide having a perovskite structure as the main component. The composite oxide has a composition expressed by the chemical formula (1)

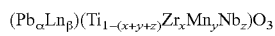   Chemical formula (1)

where, Ln is a lanthanoid element, signifying at least one element selected from the group consisting of La, Ce, Pr, Nd, Pm, Sm, Eu, Gd, Th, Dy, Ho, Er, Tm, Yb, and Lu. As of these lanthanoid elements, Ln is preferably at least one element selected from the group consisting of La, Pr, Ho, Gd, Sm, and Er, and La is more preferable.

The above composite oxide satisfies $0.91 \leq \alpha \leq 1.00$. If $\alpha$ is less than 0.91, the resistivity of the piezoelectric ceramic composition easily decreases, and thus the polarization treatment to confer the piezoelectric properties to the piezoelectric ceramic composition tends to become difficult to conduct at the time of manufacturing the piezoelectric element 2. If $\alpha$ exceeds 1.0, $Q_{max}$ tends to become small. These tendencies can be suppressed by retaining the value of $\alpha$ within the above range. From a similar point of view, $0.93 \leq \alpha \leq 0.98$ is preferable.

The above composite oxide satisfies $0 < \beta \leq 0.08$. By containing Ln in the composite oxide structuring the piezoelectric ceramic composition within the range of $0 < \beta \leq 0.08$, $Q_{max}$ increases. If $\beta$ is zero, the sintering performance of the piezoelectric element 2 tends to deteriorate, and adequate piezoelectric characteristics cannot be attained in some cases. If $\beta$ exceeds 0.08, the Curie temperature becomes lower, which likely induces depolarization when the piezoelectric element 2 is heated. By regulating the value of $\beta$ in the above range, these tendencies can be suppressed. From a similar point of view, $0.02 \leq \beta \leq 0.06$ is preferable.

The above composite oxide satisfies $0.125 \leq x \leq 0.30$. If x is less than 0.125, the temperature characteristics of oscillation frequency $F_0$ tends to deteriorate. If x exceeds 0.300, the Curie temperature becomes lower, and there likely induces depolarization when the piezoelectric element 2 is heated. By regulating the value of x within the above range, these tendencies can be suppressed. From a similar point of view, $0.13 \leq x \leq 0.25$ is preferable, $0.13 \leq x \leq 0.20$ is more preferable, and $0.13 \leq x \leq 0.16$ is most preferable. If $x \geq 0.125$, $ZrO_2$ exists in the composite oxide in relatively large amounts to the extent exceeding 5% by weight of $ZrO_2$ to the weight of the portion coming from oxides of Pb, Ln, and Ti among the composite oxides of the formula (1).

The above composite oxide satisfies $0.020 \leq y \leq 0.050$. If y is less than 0.020, $Q_{max}$ tends to become smaller. If y exceeds 0.050, the resistivity of the piezoelectric ceramic composition easily decreases, and thus the polarization treatment to confer the piezoelectric characteristics to the piezoelectric ceramic composition tends to become difficult to conduct at the time of manufacturing the piezoelectric element 2. By regulating the value of y within the above range, these tendencies can be suppressed. From a similar point of view, $0.020 \leq y \leq 0.037$ is preferable.

The above composite oxide satisfies $0.040 \leq z \leq 0.070$. If z is less than 0.040, the sintering property of the piezoelectric element 2 tends to deteriorate. If z exceeds 0.070, the specific resistance becomes so high that the property degradation caused by the thermal impact test tends to become larger. By regulating the value of z within the above range, these tendencies can be suppressed. From a similar point of view, $0.053 \leq z \leq 0.070$ is preferable.

The piezoelectric ceramic composition has a composition expressed by the chemical formula (1). However, the piezoelectric ceramic composition may contain a compound with metallic elements except Pb, Ln, Ti, Zr, Mn, and Nb as an impurity or a trace additive. Such compounds include oxide of Na, K, Al, Si, P Ca, Fe, Zn, Hf, W, Cu, or Ta. When above piezoelectric ceramic composition contains those oxides and the like, the sum of the content rate of the respective oxides in the piezoelectric ceramic composition is preferably 0.01% by weight or less, (0.3% by weight or less for Hf oxides), in terms of the oxide of each element, to the entire piezoelectric ceramic composition. In other words, 99.9% by weight or more of the piezoelectric ceramic composition is preferably a composite oxide composed of an oxide of Pb, Ln, Ti, Zr, Mn, or Nb.

In the piezoelectric ceramic composition, a part of Pb and Ln positioned at A-site of the perovskite type crystal structure $ABO_3$ may be substituted by an alkali earth metal of Ca, Sr, Ba, or the like.

The above piezoelectric ceramic composition has a tetragonal system perovskite type structure at room temperature (about 15° C. to about 35° C.). The lattice constant in the direction of a-axis of the perovskite type crystal structure (the length of a-axis of the crystal lattice of the perovskite structure) is within the range of 3.91 to 4.02 Angstrom.

According to the embodiment, since the piezoelectric element 2 included in the oscillator 1 is structured by a piezoelectric ceramic composition having the above-specified range of length of a-axis, good temperature characteristics of oscillation frequency $F_0$ is attained even when the oscillator 1 is used in an oscillation circuit as the oscillator utilizing third harmonic mode of thickness longitudinal vibration. In other words, in the embodiment the variation rate $RF_0$ (unit: %) of the oscillation frequency $F_0$ can be decreased against the temperature changes. According to the embodiment, the Curie temperature of the piezoelectric ceramic composition can be set to a desired value. The change rate $RF_0$ is defined by the equation (1) when the temperature of the oscillator 1 changes from the standard temperature $T_0$ (unit: ° C.) to an arbitrary temperature T (unit: ° C.).

$$RF_0 = \{F_0(T) - F_0(T_0)\}/F_0(T_0) \times 100 \qquad \text{Eq. (1)}$$

where, $F_0(T_0)$ is the oscillation frequency $F_0$ when the temperature of the oscillator 1 is the standard temperature $T_0$ (25° C., for example), and $F_0(T)$ is the oscillation frequency $F_0$ when the temperature of the oscillator 1 is the temperature T.

It is known that quartz which has long been used as the oscillator varies the frequency-temperature characteristics depending on the cut-angle thereof, and that the plot of the variation rate of the oscillation frequency of the oscillator using the quartz against the temperature can be approximated by a quadratic curve or a cubic curve, (refer to pp. 119-121 of "Oscillator, Resonator, Filter Latest Technologies, 1986 edition", Sogo Gijutsu Shuppan Co., Ltd.) Also in the oscillator 1 equipped with the piezoelectric element 2 composed of the piezoelectric ceramic composition of the embodiment, similar to the oscillator using quartz, the variation rate $RF_0$ of the oscillation frequency $F_0$ against the temperature changes can be approximated by the quadratic curve (quadratic function) of the temperature T of the oscillator 1, expressed by the equation (2).

$$RF_0(T) = aT^2 + bT + c, (a, b, \text{ and } c \text{ are each a real number}) \qquad \text{Eq. (2)}$$

where the value $2a$ which is doubled value of the coefficient a in Eq. (2) is defined as the curvature of the variation rate $RF_0(T)$. According to findings by the inventors of the present invention, the curvature $2a$ of the variation rate $RF_0(T)$ in the oscillator 1 can be decreased than ever before since the length of a-axis of the crystal lattice of the piezoelectric ceramic composition is within the range of 3.91 to 4.02 Angstrom. The amount of change $\Delta RF_0$ of the variation rate $RF_0(T)$ against the amount of temperature change $\Delta T$ in the oscillator 1 is expressed by the equation (3) which is derived from the equation (2).

$$\Delta RF_0 = RF_0(T + \Delta T) - RF_0(T) = 2a \times (\Delta T \times T + (\Delta T)^2/2) + b\Delta T \qquad \text{Eq. (3)}$$

As is obvious from Eq. (3), according to the embodiment, the amount of change $\Delta RF_0$ of the variation rate $RF_0$ against the amount of temperature change $\Delta T$ in the oscillator 1 can be decreased by decreasing the curvature $2a$ of the variation rate $RF_0(T)$. In other words, the variation rate $RF_0$ of the oscillation frequency $F_0$ can be stabilized against the temperature change of the oscillator 1.

Furthermore, smaller curvature $2a$ reduces variability in the variation rate $RF_0$ caused by the fluctuations in process conditions such as composition of the piezoelectric ceramic composition and firing, in the manufacturing process of the oscillator 1. Consequently, the variation rate $RF_0$ of the oscillator 1 is easily within a desired narrow tolerance (specification of the product). That is, in the manufacturing of oscillator 1, the control range of composition and process conditions of the piezoelectric ceramic composition has a margin, and thus the yield can be improved.

Oscillator can be applied to, for example, a resonator which is an element generating standard clock for controlling a microcomputer. Conventionally, quartz oscillator has been used as the resonator. However, since quartz oscillator is expensive, an oscillator equipped with an inexpensive piezoelectric element has been required to be used as the resonator in terms of replacement of the quartz oscillator or the like. As the resonator for controlling a microcomputer, there is required an oscillator which has a narrow tolerance of oscillation frequency $F_0$, and which has performance of the absolute value of the variation rate $RF_0$ of the oscillation frequency $F_0$ being 0.1% or less, preferably 0.05% or less. Since smaller absolute value of the curvature $2a$ of the variation rate $RF_0$ attains small absolute value of $RF_0$ more easily, it is required to bring the absolute value of the curvature $2a$ of the variation rate $RF_0$ to 20.0 or less from the standpoint of manufacturing the oscillator. This is because the value of curvature $2a$ is readily controlled in manufacturing since it is a variable determined almost solely by the composition, and because the value of variation rate $RF_0$ is a variable which varies not only by the composition, but also by the manufacturing conditions such as firing condition and electrode formation, and thus the value of variation rate $RF_0$ is difficult to control. In other words, as absolute value of the curvature $2a$ increases, the possibility that variation rate $RF_0$ varies and does not satisfy a product specification due to manufacturing reasons becomes higher. Based on the above reasons, the oscillator 1 of the embodiment preferably has a narrow tolerance of the oscillation frequency $F_0$, and has the absolute value of the variation rate $RF_0$ of the oscillation frequency $F_0$ of 0.1% or less, preferably 0.05% or less, and has the absolute value of the curvature $2a$ of the variation rate $RF_0$ of 20.0 or less. That type of oscillator 1 is suitable for the oscillator for oscillation circuit of personal computer.

When the above piezoelectric ceramic composition has the composition expressed by the above chemical formula (1), and satisfies $0.91 \leq \alpha \leq 1.00$, $0 < \beta \leq 0.08$, $0.125 \leq x \leq 0.300$, $0.020 \leq y \leq 0.050$, and $0.040 \leq z \leq 0.070$, the lattice constant in the direction of a-axis (length of a-axis of the crystal lattice) of the piezoelectric ceramic composition can surely be set to 3.91 to 4.02 Angstrom. For further surely attaining the length of a-axis of 3.91 to 4.02 Angstrom, it is specifically important for the piezoelectric ceramic composition to satisfy $0.125 \leq x \leq 0.300$.

According to the embodiment, the piezoelectric element 2 in the oscillator 1 is formed by the above piezoelectric ceramic composition. Accordingly, when the oscillator 1 is used in an oscillation circuit as the oscillator utilizing third harmonic mode of thickness longitudinal vibration, sufficiently high $Q_{max}$ and good temperature characteristics of oscillation frequency $F_0$ can be attained. In addition, the Curie temperature of the piezoelectric ceramic composition can be brought to a desired value.

The method for manufacturing the above oscillator 1 of the embodiment is mainly composed of the steps of: granulating raw material powder for the piezoelectric element 2; forming a molded article by press-molding the raw material powder; forming a sintered body by firing the molded article; forming the piezoelectric element 2 by polarizing the sintered body; and forming a vibrating electrode 3 on the piezoelectric element 2. The detail of the method for manufacturing the oscillator 1 is described below.

First, the starting raw materials for forming the piezoelectric ceramic composition are prepared. Oxides of the respective elements structuring the composite oxide having the perovskite structure, expressed by the above chemical formula (1), and/or compounds converting to these oxides after firing, (carbonate, hydroxide, oxalate, nitrate, and the like) can be used as the starting raw materials. Specific starting raw materials include PbO and a compound of lanthanoid element (such as $La_2O_3$, $La(OH)_3$), $TiO_2$, $ZrO_2$, $MnO_2$, $MnCO_3$, and $Nb_2O_5$). Those starting raw materials are mixed together at a weight ratio to form a piezoelectric ceramic composition containing a composite oxide having the composition expressed by the above chemical formula (1) after firing.

Then, thus prepared starting raw materials are wet-mixed in a ball-mill or the like. The wet-mixed starting raw materials are preliminarily formed to a preliminarily-molded article, which is then preliminarily fired. By the preliminarily-firing, the preliminarily-fired body containing the above-described piezoelectric ceramic composition of the embodiment is obtained. The temperature of preliminarily-firing is preferably within the range of 700° C. to 1050° C., and more preferably 800° C. to 1050° C. The preliminarily-firing period is preferably about 1 to about 3 hours. If the temperature of preliminarily-firing is excessively low, the chemical reaction in the preliminarily-molded article tends to fail in sufficient proceeding. If the temperature thereof is excessively high, the preliminarily-molded article begins to sinter, which tends to make it difficult to perform succeeding pulverization. The preliminarily-firing may be carried out in the air, or may be carried out in an atmosphere having higher oxygen partial pressure than that in the air, or in pure-oxygen atmosphere. The wet-mixed starting raw materials may be subjected to preliminarily-firing without preliminary forming.

Thus obtained preliminarily-fired body is slurried, followed by finely pulverizing (wet-pulverization) in ball-mill or the like, which is then dried to obtain fine powder. A binder is added to thus prepared fine powder, if required, to granulate the raw material powder. The solvent to slurry the preliminarily-fired body is preferably water, alcohol such as ethanol, a mixed solvent of water and ethanol, and the like. The binder being added to the fine powder includes commonly-used organic binders such as polyvinyl alcohol, polyvinyl alcohol with a dispersant, and ethyl cellulose.

Next, the raw material powder is press-molded to form the molded article. The load during press-molding may be, for example, 100 to 400 MPa.

The obtained molded article is subjected to binder-removal treatment. The binder-removal treatment is preferably conducted at a temperature ranging from 300° C. to 700° C. for about 0.5 to 5 hours. The binder-removal treatment may be conducted in the air, or may be conducted in an atmosphere having higher oxygen partial pressure than that in the air, or in pure-oxygen atmosphere.

After the binder-removal treatment, the molded article is fired to obtain a sintered body composed of a piezoelectric ceramic composition. The firing temperature may be preferably within the range of 1050° C. to 1250° C., and more preferably about 1150° C. to 1250° C. The firing period may be from about 1 to 8 hours. The binder-removal treatment and the firing process of the molded article may be carried out successively or separately.

Then, the sintered body is cut into thin sheets, which are surface-worked by lapping. Cutting of the sintered body can be done by a cutting machine such as cutter, slicer, or dicing saw. After the surface-working, a temporary electrode for polarization treatment is formed on each side of the thin-sheet sintered body. The conductive material for structuring the temporary electrode is preferably Cu because Cu is readily removed by the etching treatment using ferric chloride solution. Formation of the temporary electrode preferably uses vacuum vapor deposition method or sputtering.

To the thin-sheet sintered body with temporary electrodes formed for polarization treatment, a polarization electric field is applied to conduct the polarization treatment. The condition of polarization treatment may be adequately selected depending on the composition of the sintered body (piezoelectric ceramic composition). Normally, however, the temperature of sintered body being treated by the polarization may be within the range of 50° C. to 300° C., the period of applying the polarization electric field may be within the range of 1 to 30 minutes, and the magnitude of the polarization electric field may be 0.9 times or more the coercive electric field of the sintered body.

After the polarization treatment, the temporary electrode is removed from the sintered body by etching treatment and the like. Then, the sintered body is cut into a desired element shape to form the piezoelectric element 2. By forming the vibrating electrode 3 on the piezoelectric element 2, the oscillator 1 of the embodiment is perfected. Formation of the vibrating electrode 3 is preferably carried out by vacuum vapor deposition method or sputtering.

The preferred embodiment of the piezoelectric ceramic composition and of the oscillator according to the present invention is described above. The present invention, however, is not limited to these above-mentioned embodiments.

For example, the piezoelectric ceramic composition according to the present invention can be applied to filter, actuator, ultrasonic cleaning machine, ultrasonic motor, oscillator for fogging machine, fish detector, shock sensor, ultrasonic diagnosis apparatus, waste-toner sensor, gyro sensor, buzzer, transformer, cigarette lighter, and the like, other than to oscillator.

EXAMPLES

The present invention is described in more detail in the following examples. The present invention, however, is not limited to these examples.

As starting raw materials for the respective piezoelectric ceramic compositions of Samples 1 to 60, there were prepared powder raw materials of lead oxide (PbO), lanthanum hydroxide ($La(OH)_3$), titanium hydroxide ($TiO_2$), zirconium oxide ($ZrO_2$), manganese carbonate ($MnCO_3$), niobium oxide ($Nb_2O_5$), cerium oxide ($CeO_2$), praseodymium oxide ($Pr_6O_{11}$), strontium carbonate ($SrCO_3$), and manganese carbonate ($MnCO_3$).

(Sample 1) Next, these respective powder raw materials were weighed and then mixed together so as the piezoelectric ceramic composition that structures the ceramic sample after principal firing, (sintered body), to have the composition of "Sample 1" in Table 1. The mixture of thus prepared powder raw materials was blended with pure water in a ball-mill containing Zr balls for 10 hours to obtain slurry. The slurry was fully dried, and was press-molded, which molded article was preliminarily fired at 900° C. to obtain a preliminarily-fired body. The preliminarily-fired body was finely pulverized in a ball-mill. The pulverized preliminarily-fired body was dried. An adequate amount of polyvinyl alcohol (PVA) as a binder was added to the dried preliminarily-fired body to granulate. About 3 g of thus obtained granulated powder was put in a mold having a size of 20 mm in length and 20 mm in width, which was then molded in a uniaxial screw press-molding machine under load 245 MPa. The molded sample was heat-treated to remove the binder, and then was treated by principal firing at a temperature ranging from 1150° C. to 1250° C. for 2 hours, thus obtained the ceramic sample (Sample 1) as the sintered body structured by the piezoelectric ceramic composition. Using a similar procedure, pluralities of ceramic samples as a "Sample 1" were prepared.

One of thus prepared ceramic samples was flat-worked on a two-face lapping machine to a thickness of 0.4 mm, which was then cut by a dicing saw to a size of 6 mm in length and 6 mm in width. To each end of the cut ceramic sample, an Ag paste was deposited by vacuum vapor deposition, and thus a pair of Ag electrodes each having a size of 5 mm×5 mm was formed. The ceramic sample having the Ag electrode formed was put in an electric furnace. Using an LCR meter, there were measured the temperature giving the maximum capacitance of the ceramic sample during the temperature-increase process and the temperature-decrease process, respectively. From the average value of thus measured temperatures, the Curie temperature Tc was derived. The result is given in Table 1. To maintain normal functioning of the oscillator even at high temperatures, the piezoelectric element (the ceramic sample of Sample 1) is required to keep the piezoelectric characteristics even at high temperatures, and thus higher Curie temperature Tc is more preferable. Specifically, since the piezoelectric element is requested not to depolarize even when the oscillator is exposed to high temperatures in the solder-reflow process and the like, it is specifically preferable that the Curie temperature Tc is 300° C. or above.

A ceramic sample (Sample 1) different from that for measuring the Curie temperature Tc was flat-worked on a two-face lapping machine to a thickness of 0.4 mm. The flat sample was cut by a dicing saw to a size of 16 mm in length and 16 mm in width. An Ag paste was applied to each side of the cut ceramic sample to prepare a pair of temporary electrodes having a size of 15 mm×15 mm for polarization treatment. To the ceramic sample having the temporary electrodes formed, polarization treatment was given in a silicone oil bath at 120° C. applying a polarization electric field having an intensity of double the coercive electric field, for 15 minutes. After the polarization treatment, the ceramic sample from which the temporary electrode was removed was again polished on a lapping machine to a thickness of about 0.25 mm, which was then cut by a dicing saw to form the piezoelectric element 2 having a size of 7 mm×4.5 mm. Then, the vibrating electrode 3 was formed on each side of the piezoelectric element 2 using a vacuum vapor deposition apparatus to obtain the oscillator 1 having similar structure to that of FIGS. 1 and 2. The vibrating electrode 3 was formed by the Ag layer with a thickness of 1.5 μm.

The value of $Q_{max}$ of the oscillator 1 was measured using an impedance analyzer (4294A, manufactured by Agilent Technologies, Inc.) in third harmonic mode of thickness longitudinal vibration at near 30 MHz. The result is shown in Table 1. Since $Q_{max}$ contributes to the stable oscillation, higher $Q_{max}$ is more preferable.

Figure 3:
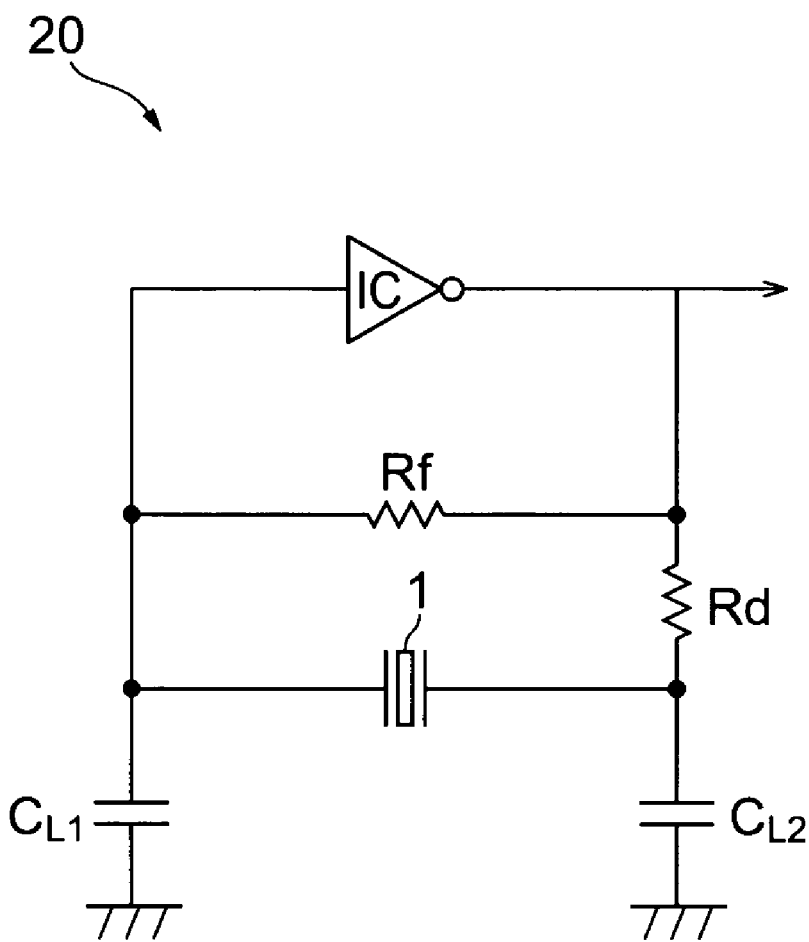
FIG. 3 shows a Colpitts oscillation circuit equipped with an oscillator.

Then, as shown in FIG. 3, the oscillator 1 was connected with parallel capacitors $C_{L1}$ and $C_{L2}$ having the respective specific capacitances to form a Colpitts oscillation circuit 20 together with an IC. In the Colpitts oscillation circuit 20, Rf designates feedback resistor and Rd designates limiting resistor. The Colpitts oscillation circuit 20 was connected with a specified DC power source (not shown). The Colpitts oscillation circuit 20 was put in a thermostat bath at 25° C. When the temperature inside the thermostat bath was stabilized at 25° C., (when the temperature T of the oscillator 1 was stabilized at 25° C.), the oscillation frequency (hereinafter referred to as $F_0(25°$ C.)) was measured. In addition, the temperature of thermostat bath holding the Colpitts oscillation circuit 20 was set to −40° C., and the oscillation frequency was measured when the temperature inside the thermostat bath was stabilized at −40° C., (hereinafter referred to as $F_0(-40°$ C.)). Furthermore, the temperature of thermostat bath holding the Colpitts oscillation circuit 20 was set to 85° C., and the oscillation frequency was measured when the temperature inside the thermostat bath was stabilized at 85° C., (hereinafter referred to as $F_0(85°$ C.)). The measurement of the oscillation frequencies $F_0(25°$ C.), $F_0(-40°$ C.), and $F_0(85°$ C.) was conducted using a frequency counter (53181A, manufactured by Agilent Technologies, Inc.).

From the measured oscillation frequencies $F_0(25°$ C.), $F_0(-40°$ C.), and $F_0(85°$ C.), the temperature characteristic values $F_0TC1$ and $F_0TC2$ (unit: ppm/° C.) for the oscillation frequency $F_0$ were determined using the following equations (4) and (5). The result is given in Table 1. Smaller $F_0TC1$ and $F_0TC2$, respectively, mean better stabilization of the oscillation frequency $F_0$ against the temperature changes, which means that temperature characteristics of $F_0$ are good. Accordingly, smaller $F_0TC1$ and smaller $F_0TC2$ are more preferable.

$$F_0TC1(\text{ppm}/°\text{C.}) = \frac{F_0(25°\text{ C.}) - F_0(-40°\text{ C.})}{\{25°\text{ C.}-(-40°\text{ C.})\} \times F_0(25°\text{ C.})} \times 10^6 \quad \text{Eq (4)}$$

$$F_0TC2(\text{ppm}/°\text{C.}) = \frac{F_0(85°\text{ C.}) - F_0(25°\text{ C.})}{(85°\text{ C.}-25°\text{ C.}) \times F_0(25°\text{ C.})} \times 10^6 \quad \text{Eq (5)}$$

(Samples 2 to 30) The respective ceramic samples 2 to 30 were prepared using a similar procedure to that for Sample 1 except that the respective powder raw materials were mixed so as the piezoelectric ceramic composition structuring the ceramic sample (sintered body) after principal firing to have the respective compositions of Samples 2 to 30 given in Table 1. Using a similar procedure to that for Sample 1, there were determined the Curie temperature Tc, $Q_{max}$, $F_0TC1$, and $F_0TC2$ for Samples 2 to 30. The result is given in Table 1. As of Samples 1 to 30 given in Table 1, preferred samples are those having the Curie temperature Tc of 300° C. or above, $Q_{max}$ of 10 or more, and both $F_0TC1$ and $F_0TC2$ of 15 ppm/° C. or less.

TABLE 1

| Sample No. | Composition of ceramic sample (piezoelectric ceramic composition) $(Pb_\alpha La_\beta)(Ti_{1-(x+y+z)}Zr_xMn_yNb_z)O_3$ | | | | | Tc (°C.) | $Q_{max}$ | $F_0TC1$ (ppm/°C.) | $F_0TC2$ (ppm/°C.) | Remark |
|---|---|---|---|---|---|---|---|---|---|---|
| | α | β | x | y | z | | | | | |
| 1 | 0.950 | 0.050 | 0.050 | 0.033 | 0.067 | 358 | 14.0 | −5 | 19 | — |
| 2 | 0.950 | 0.050 | 0.100 | 0.033 | 0.067 | 346 | 13.8 | −2 | 16 | — |
| 3 | 0.950 | 0.050 | 0.200 | 0.033 | 0.067 | 318 | 10.1 | 9 | −13 | — |
| 4 | 0.950 | 0.050 | 0.400 | 0.033 | 0.067 | 262 | 7.1 | 17 | −11 | — |
| 5 | 1.000 | 0.000 | 0.200 | 0.020 | 0.040 | 432 | — | — | — | No piezoelectric characteristics |
| 6 | 1.000 | 0.000 | 0.200 | 0.027 | 0.053 | 428 | — | — | — | No piezoelectric characteristics |
| 7 | 1.000 | 0.000 | 0.200 | 0.033 | 0.067 | 418 | — | — | — | No piezoelectric characteristics |
| 8 | 0.945 | 0.050 | 0.130 | 0.030 | 0.070 | 336 | 13.6 | −5 | 6 | — |
| 9 | 0.945 | 0.050 | 0.130 | 0.032 | 0.068 | 337 | 13.9 | −6 | 7 | — |
| 10 | 0.945 | 0.050 | 0.130 | 0.033 | 0.067 | 338 | 13.9 | −7 | 11 | — |
| 11 | 0.945 | 0.050 | 0.130 | 0.035 | 0.065 | 343 | 13.7 | −9 | 11 | — |
| 12 | 0.945 | 0.050 | 0.130 | 0.037 | 0.063 | 341 | 14.6 | −12 | 14 | — |
| 13 | 0.890 | 0.050 | 0.130 | 0.033 | 0.067 | 349 | — | — | — | Polarization treatment was inapplicable owing to low resistivity |
| 14 | 0.910 | 0.050 | 0.130 | 0.033 | 0.067 | 344 | 18.3 | −10 | 12 | — |
| 15 | 0.930 | 0.050 | 0.130 | 0.033 | 0.067 | 342 | 15.2 | −8 | 9 | — |
| 16 | 0.940 | 0.050 | 0.130 | 0.033 | 0.067 | 343 | 12.9 | −8 | 9 | — |
| 17 | 0.945 | 0.050 | 0.130 | 0.033 | 0.067 | 341 | 13.4 | −8 | 9 | — |
| 18 | 0.950 | 0.050 | 0.130 | 0.033 | 0.067 | 342 | 13.3 | −7 | 9 | — |
| 19 | 0.955 | 0.050 | 0.130 | 0.033 | 0.067 | 340 | 13.7 | −7 | 9 | — |
| 20 | 0.960 | 0.050 | 0.130 | 0.033 | 0.067 | 342 | 12.4 | −7 | 9 | — |
| 21 | 0.930 | 0.040 | 0.130 | 0.033 | 0.067 | 359 | 16.4 | −8 | 11 | — |
| 22 | 0.950 | 0.020 | 0.130 | 0.033 | 0.067 | 388 | 13.4 | −5 | 11 | — |
| 23 | 0.950 | 0.040 | 0.130 | 0.033 | 0.067 | 358 | 13.4 | −6 | 9 | — |
| 24 | 0.960 | 0.040 | 0.130 | 0.033 | 0.067 | 356 | 14.9 | −6 | 9 | — |
| 25 | 0.970 | 0.030 | 0.130 | 0.033 | 0.067 | 376 | 12.5 | −4 | 8 | — |
| 26 | 0.950 | 0.060 | 0.130 | 0.033 | 0.067 | 319 | 12.6 | −6 | 7 | — |
| 27 | 0.970 | 0.040 | 0.130 | 0.033 | 0.067 | 355 | 14.0 | −6 | 9 | — |
| 28 | 0.950 | 0.050 | 0.150 | 0.030 | 0.060 | 336 | 12.7 | −3 | 4 | — |
| 29 | 0.960 | 0.040 | 0.150 | 0.030 | 0.060 | 355 | 11.0 | −1 | 3 | — |
| 30 | 0.960 | 0.040 | 0.160 | 0.030 | 0.060 | 352 | 10.8 | −1 | 1 | — |

As shown in Table 1, it was confirmed that Samples 3, 8 to 12 and 14 to 30, in which the piezoelectric ceramic composition structuring the ceramic sample satisfies $0.91 \leq \alpha \leq 1.00$, $0 < \beta \leq 0.08$, $0.125 \leq x \leq 0.300$, $0.020 \leq y \leq 0.037$, and $0.040 \leq z \leq 0.070$, gave Curie temperature Tc of 300° C. or above, $Q_{max}$ of 10 or more, and each $F_0TC1$ and $F_0TC2$ of 15 ppm/° C. or less.

For Samples 1 and 2, in which x is less than 0.125, it was confirmed that $F_0TC2$ is large, and that the temperature characteristics of oscillation frequency $F_0$ is not good. For Sample 4 in which x exceeds 0.300, it was confirmed that the Curie temperature Tc is below 300° C., and that $F_0TC1$ is large.

For Sample 13 in which α is less than 0.91, the resistivity of the ceramic sample was so low that the polarization treatment could not confer satisfactory piezoelectric properties to the ceramic sample.

(Sample 31) Pluralities of ceramic samples (Sample 31) were prepared using a similar procedure to that for Sample 1 except that the respective powder raw materials were weighed and mixed together so as the piezoelectric ceramic composition structuring the ceramic sample (sintered body) after firing to have the composition of "Sample 31" given in Table 2.

The Curie temperature Tc of thus prepared ceramic sample (Sample 31) was determined by a similar procedure to that for Sample 1. The result is given in Table 2.

Using a ceramic sample (Sample 31) different from that for determining the Curie temperature Tc, the X-ray diffraction pattern was determined. From thus determined X-ray diffraction pattern, it was confirmed that Sample 31 has a tetragonal system perovskite type crystal structure at room temperature. From the calculation based on the X-ray diffraction pattern, it was confirmed that the length of a-axis of the crystal lattice of the perovskite type crystal structure, (hereinafter referred to as the "a-axis length"), is 3.914 Angstrom.

Using a ceramic sample (Sample 31) different from the sample for determining the Curie temperature Tc, the oscillator 1 of the Sample 31 was prepared by a similar procedure to that for Sample 1.

Then, using a similar procedure to that for Sample 1, the oscillation frequency $F_0(25°$ C.) of the oscillator 1 of Sample 31 was determined. Using a similar procedure to that for determining $F_0(25°$ C.), there were determined $F_0(-40°$ C.), $F_0(-20°$ C.), $F_0(-10°$ C.), $F_0(0°$ C.), $F_0(50°$ C.), $F_0(70°$ C.), and $F_0(85°$ C.) of the oscillator 1 of Sample 31.

Then, the observed value of $F_0(25°$ C.) was substituted for $F_0T_0$ of Eq. (1), $RF_0 = \{F_0(T) - F_0(T_0)\}/F_0(T_0) \times 100$, and the determined value of $F_0(-40°$ C.) was substituted for $F_0(T)$ thereof, and thus $RF_0(-40°$ C.), (unit: %) was calculated. Furthermore, using a similar procedure to that for determining $RF_0(-40°$ C.), there were determined $RF_0(-20°$ C.), $RF_0$ ($-10°$ C.), $RF_0$($0°$ C.), $RF_0$($25°$ C.), $RF_0$($50°$ C.), $RF_0$($70°$ C.), and $RF_0$($85°$ C.). These values are given in Table 3. As of $RF_0$($-40°$ C.) and $RF_0$($85°$ C.), the one having larger absolute value (hereinafter referred to as the "$F_0$ variation rate") is given in Table 2. Smaller absolute value of the $F_0$ variation rate means better stabilization of the oscillation frequency $F_0$ against the temperature changes, and better temperature characteristic of $F_0$.

Figure 4:
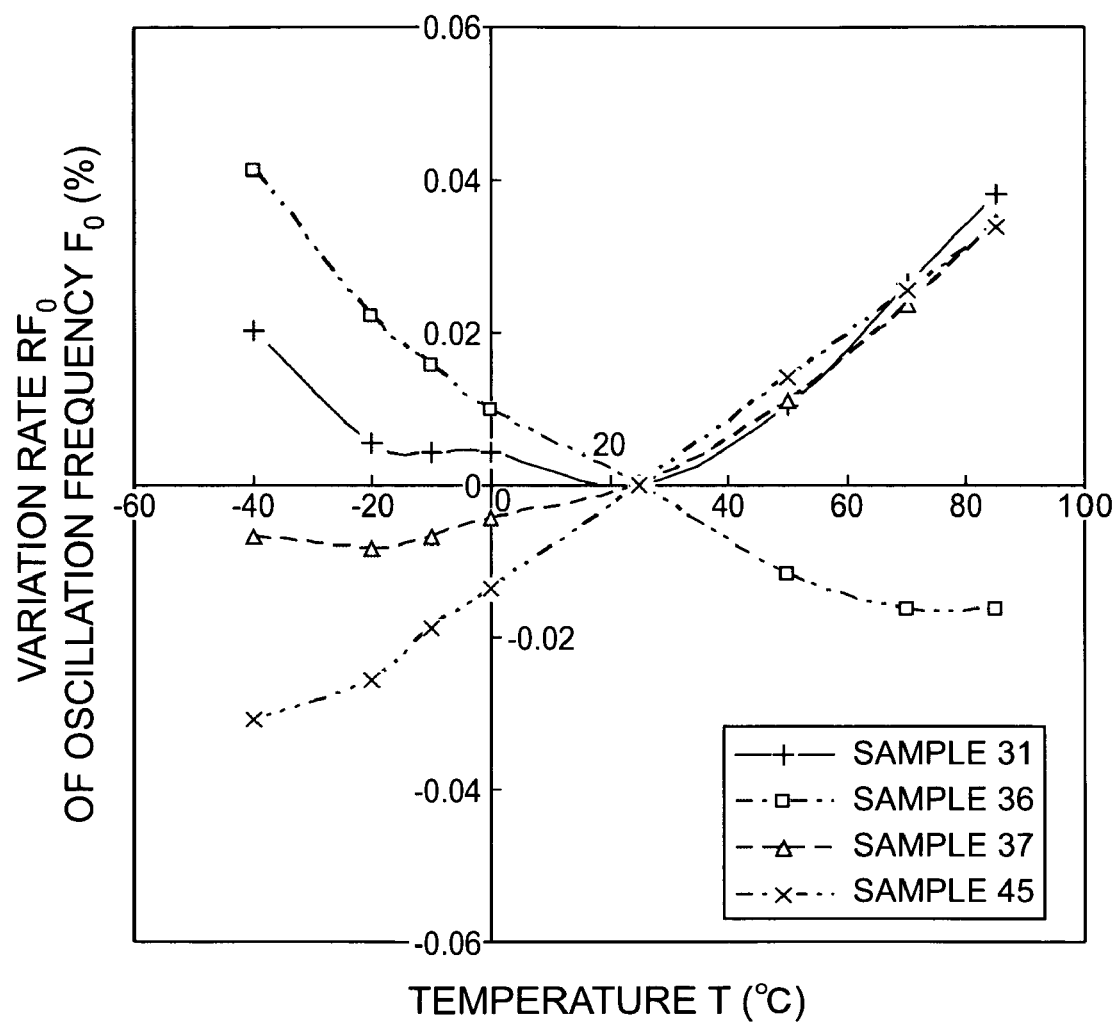
FIG. 4 is a graph plotting the variation rate $RF_0$ against the temperature T of the oscillator.

As shown in FIG. 4, there were plotted $RF_0$($-40°$ C.), $RF_0$($-20°$ C.), $RF_0$($-10°$ C.), $RF_0$($0°$ C.), $RF_0$($25°$ C.), $RF_0$ ($50°$ C.), $RF_0$($70°$ C.), and $RF_0$($85°$ C.) against the temperature T of the oscillator 1 of Sample 31. To the plot, the quadratic function Eq. (2): $RF_0(T)=aT^2+bT+c$, (a, b, and c are each an actual number), was fitted to determine the curvature 2a of the variation rate $RF_0(T)$ of the oscillation frequency $F_0$ in the oscillator 1 of Sample 31. The result is given in Table 2. Smaller curvature 2a means better stabilization of the variation rate $RF_0$ of the oscillation frequency $F_0$ against the temperature changes of the oscillator 1, and means better temperature characteristics of the oscillation frequency $F_0$. The curve of Sample 31 given in FIG. 4 uses an approximate curve, not the quadratic curve, for convenience of illustration. Same is applied also to the curves of Samples 36, 37, and 45, described later.

Figure 5:
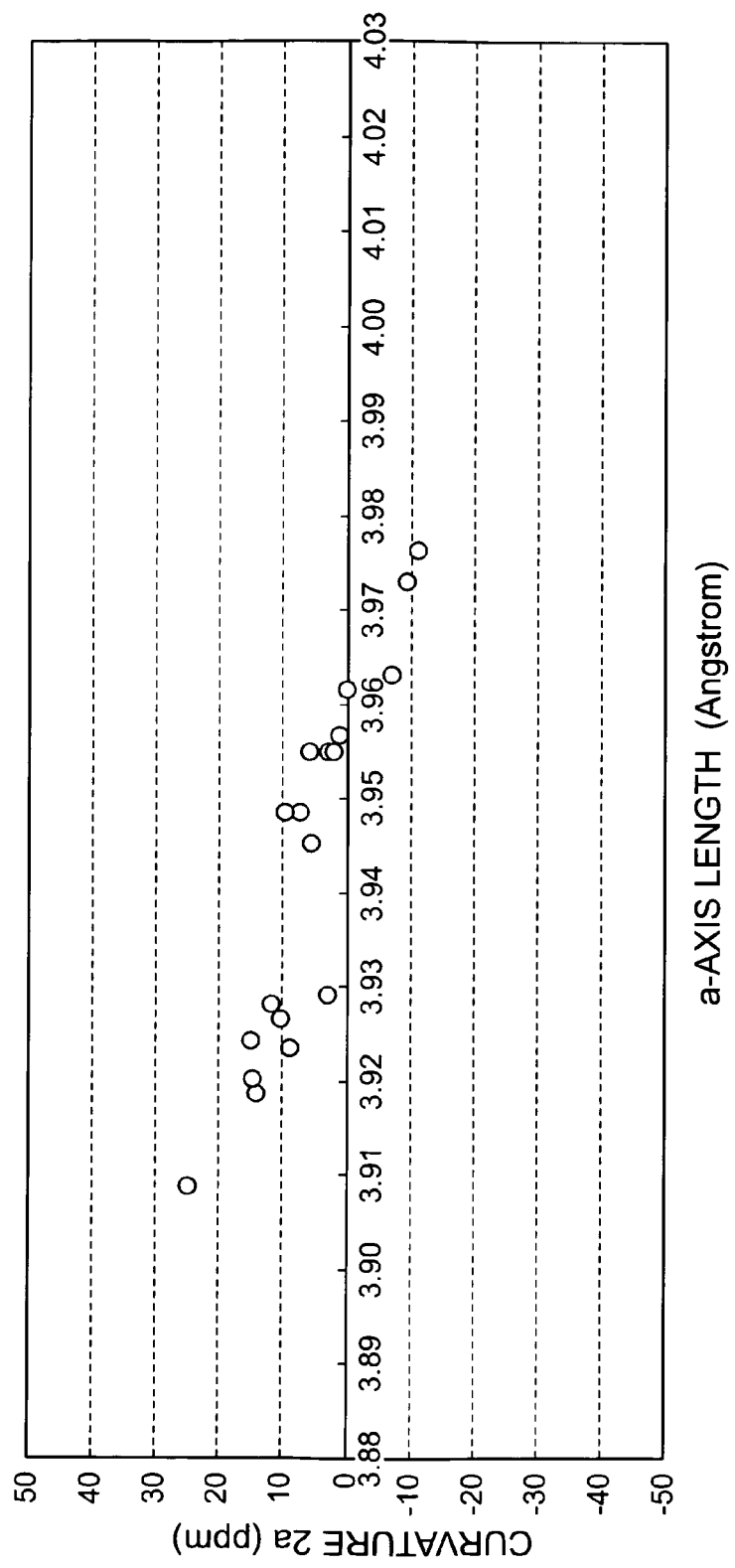
FIG. 5 is a graph plotting the curvature $2a$ against the length of a-axis.

(Samples 32 to 50) The respective ceramic samples were prepared as the Samples 32 to 50 using a similar procedure to that for Sample 31 except that the respective powder raw materials were mixed so as the piezoelectric ceramic compositions structuring the ceramic sample (sintered body) after principal firing to have the respective compositions of Samples 32 to 50 given in Table 2. The X-ray diffraction pattern was determined for each of Samples 32 to 50. Based on thus determined X-ray diffraction pattern, it was confirmed that all the Samples 32 to 50 have a tetragonal system perovskite type crystal structure at room temperature. Based on the X-ray diffraction patterns of Samples 32 to 50, the respective a-axis lengths were determined. The result is given in Table 2. Furthermore, using a similar procedure to that for Sample 31, there were determined Curie temperature Tc, $F_0$ variation rate, and curvature 2a of Samples 32 to 50. The result is given in Table 2. In FIG. 5, the curvature 2a of Samples 31 to 49 was plotted against the respective a-axis lengths. For Sample 50, the $RF_0(T)$ became a cubic function of T, not quadratic function of T, and thus the curvature 2a could not be determined. Consequently, FIG. 5 does not include a plot of Sample 50.

TABLE 2

| Sample No. | Composition of ceramic sample (piezoelectric ceramic composition) $(Pb_\alpha Ln_\beta Me_\gamma)(Ti_{1-(x+y+z)}Zr_x Mn_y Nb_z)O_3$ | | | | | | | a-Axis length (Angstrom) | Curvature 2a (ppm) | Temperature characteristics of Oscillation frequency $F_0$ $F_0$ variation rate (%) | Tc (° C.) |
|---|---|---|---|---|---|---|---|---|---|---|---|
| | α | Ln | β | Me | γ | x | y | z | | | | |
| 31 | 0.94 | La | 0.06 | — | 0.00 | 0.00 | 0.020 | 0.040 | 3.914 | 13.8 | 0.038 | 360 |
| 32 | 0.94 | La | 0.06 | — | 0.00 | 0.00 | 0.023 | 0.047 | 3.915 | 14.4 | 0.087 | 352 |
| 33 | 0.94 | La | 0.06 | — | 0.00 | 0.00 | 0.027 | 0.053 | 3.919 | 14.8 | 0.096 | 347 |
| 34 | 0.91 | La | 0.09 | — | 0.00 | 0.00 | 0.020 | 0.040 | 3.922 | 10.0 | 0.072 | 304 |
| 35 | 0.91 | La | 0.09 | — | 0.00 | 0.00 | 0.023 | 0.053 | 3.923 | 11.4 | 0.091 | 300 |
| 36 | 0.95 | La | 0.05 | — | 0.00 | 0.10 | 0.027 | 0.040 | 3.940 | 5.3 | 0.041 | 365 |
| 37 | 0.95 | La | 0.05 | — | 0.00 | 0.10 | 0.030 | 0.053 | 3.944 | 7.2 | 0.035 | 356 |
| 38 | 0.95 | La | 0.05 | — | 0.00 | 0.10 | 0.033 | 0.067 | 3.944 | 9.5 | 0.070 | 346 |
| 39 | 0.95 | La | 0.05 | — | 0.00 | 0.20 | 0.020 | 0.040 | 3.958 | −7.3 | −0.078 | 340 |
| 40 | 0.95 | La | 0.05 | — | 0.00 | 0.20 | 0.027 | 0.053 | 3.968 | −9.6 | −0.071 | 331 |
| 41 | 0.95 | La | 0.05 | — | 0.00 | 0.20 | 0.033 | 0.067 | 3.971 | −11.4 | −0.077 | 318 |
| 42 | 0.89 | La | 0.06 | Sr | 0.05 | 0.00 | 0.027 | 0.053 | 3.919 | 8.6 | 0.040 | 313 |
| 43 | 0.84 | La | 0.06 | Sr | 0.10 | 0.00 | 0.027 | 0.053 | 3.924 | 2.9 | −0.040 | 276 |
| 44 | 0.94 | Eu | 0.06 | — | 0.00 | 0.00 | 0.027 | 0.053 | 3.904 | 24.8 | 0.103 | 350 |
| 45 | 0.945 | La | 0.05 | — | 0.00 | 0.13 | 0.030 | 0.070 | 3.957 | −0.1 | 0.034 | 336 |
| 46 | 0.945 | La | 0.05 | — | 0.00 | 0.13 | 0.032 | 0.068 | 3.952 | 1.1 | 0.044 | 337 |
| 47 | 0.945 | La | 0.05 | — | 0.00 | 0.13 | 0.033 | 0.067 | 3.950 | 2.8 | 0.067 | 338 |
| 48 | 0.945 | La | 0.05 | — | 0.00 | 0.13 | 0.035 | 0.065 | 3.950 | 1.9 | 0.066 | 343 |
| 49 | 0.945 | La | 0.05 | — | 0.00 | 0.13 | 0.037 | 0.063 | 3.950 | 5.8 | 0.093 | 341 |
| 50 | 0.95 | La | 0.05 | — | 0.00 | 0.40 | 0.033 | 0.067 | 4.021 | — | −0.107 | 262 |

TABLE 3

| Variation rate $F_0$ (%) | Sample 31 | Sample 36 | Sample 37 | Sample 45 |
|---|---|---|---|---|
| $RF_0$ (−40° C.) | 0.020 | 0.041 | −0.007 | −0.031 |
| $RF_0$ (−20° C.) | 0.005 | 0.022 | −0.008 | −0.026 |
| $RF_0$ (−10° C.) | 0.004 | 0.016 | −0.007 | −0.019 |
| $RF_0$ (0° C.) | 0.004 | 0.010 | −0.004 | −0.013 |
| $RF_0$ (25° C.) | 0.000 | 0.000 | 0.000 | 0.000 |
| $RF_0$ (50° C.) | 0.010 | −0.012 | 0.011 | 0.014 |
| $RF_0$ (70° C.) | 0.026 | −0.016 | 0.024 | 0.026 |
| $RF_0$ (85° C.) | 0.038 | −0.016 | 0.035 | 0.034 |

As shown in Table 2, Samples 31 to 43, and 45 to 49, in which the a-axis length is within the range of 3.91 to 4.02 Angstrom, and it was confirmed that the absolute value of $F_0$ variation rate is small and that the Curie temperature Tc becomes high. On the other hand, in Samples 44 and 50, in which the a-axis length is outside the range of 3.91 to 4.02 Angstrom, the absolute value of $F_0$ variation rate becomes larger compared with that of Samples 31 to 43, and 45 to 49.

As seen in FIG. 5, since the curvature 2a and the a-axis length have a correlation with each other, the control of a-axis length can vary the curvature 2a. For example, if the a-axis length is within the range of 3.91 to 4.02 Angstrom, the curvature $2a$ can be brought to 20 or less.

From the above experimental results, it was confirmed that the present invention provides a piezoelectric ceramic composition which allows the attainment of sufficiently high $Q_{max}$ and good temperature characteristics of oscillation frequency $F_0$ when the piezoelectric ceramic composition is used for an oscillator utilizing third harmonic mode of thickness longitudinal vibration.

What is claimed is:

1. A piezoelectric ceramic composition containing a composite oxide having a perovskite structure, the composite oxide having a composition expressed by $(Pb_\alpha Ln_\beta)(Ti_{1-(x+y+z+)}Zr_x Mn_y Nb_z)O_3$ where Ln signifies at least one element selected from the group consisting of La, Ce, Pr, Nd, Pm, Sm, Eu, Gd, Tb, Dy, Ho, Er, Tm, Yb, and Lu, satisfying $0.91 \leq \alpha \leq 1.00$,
$0 < \beta \leq 0.08$,
$0.125 \leq x \leq 0.25$,
$0.020 \leq y \leq 0.050$, and
$0.040 \leq z \leq 0.070$.

2. The piezoelectric ceramic composition according to claim 1, wherein the perovskite structure is a tetragonal system perovskite structure, and the lattice constant in the direction of a-axis of the perovskite structure is within the range of 3.91 to 4.02 Angstrom.

3. The piezoelectric ceramic composition according to claim 1, wherein the Ln is La.

4. The piezoelectric ceramic composition according to claim 1 satisfying $0.13 \leq x \leq 0.20$.

5. The piezoelectric ceramic composition according to claim 1 satisfying $0.13 \leq x \leq 0.16$.

6. The piezoelectric ceramic composition according to claim 1 satisfying $0.020 \leq y \leq 0.037$.

7. An oscillator having a piezoelectric element composed of the piezoelectric ceramic composition according to claim 1.

* * * * *